(12) United States Patent
Tamaoka

(10) Patent No.: US 10,550,851 B2
(45) Date of Patent: Feb. 4, 2020

(54) FAN HAVING AN IMPELLER INCLUDING A RESIN PORTION AND A METAL PLATE

(71) Applicant: NIDEC CORPORATION, Kyoto (JP)

(72) Inventor: Takehito Tamaoka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/154,911

(22) Filed: Oct. 9, 2018

(65) Prior Publication Data
US 2019/0040871 A1 Feb. 7, 2019

Related U.S. Application Data

(63) Continuation of application No. 14/816,768, filed on Aug. 3, 2015, now Pat. No. 10,125,786.

(30) Foreign Application Priority Data

Dec. 26, 2014 (JP) .................................. 2014-265967

(51) Int. Cl.
*F04D 29/32* (2006.01)
*F04D 29/28* (2006.01)
(Continued)

(52) U.S. Cl.
CPC ........... *F04D 29/329* (2013.01); *F04D 25/08* (2013.01); *F04D 29/281* (2013.01); *F04D 29/30* (2013.01); *F04D 29/384* (2013.01); *F04D 29/388* (2013.01)

(58) Field of Classification Search
CPC ...... F04D 29/38; F04D 29/384; F04D 29/388; F04D 29/329; F04D 17/08; F04D 17/10;
(Continued)

(56) References Cited

U.S. PATENT DOCUMENTS

| 4,164,690 A | 8/1979 | Muller et al. |
| 9,605,682 B2 | 3/2017 | Hasegawa et al. |
(Continued)

FOREIGN PATENT DOCUMENTS

| CN | 101217859 A | 7/2008 |
| CN | 102112939 A | 6/2011 |
(Continued)

OTHER PUBLICATIONS

Related U.S. Appl. No. 14/483,843, filed Sep. 11, 2014.
(Continued)

*Primary Examiner* — Bryan M Lettman
(74) *Attorney, Agent, or Firm* — Westerman, Hattori, Daniels & Adrian, LLP

(57) ABSTRACT

A fan includes an impeller and a metallic base portion. The base portion is arranged to be in thermal contact with a heat source. The impeller includes a resin portion including a plurality of blades, and a metal plate. In addition, the metal plate includes a flat plate portion arranged below the blades. A lower surface of the flat plate portion and an upper surface of the base portion are arranged axially opposite to each other with a gap intervening therebetween. An axial dimension of the gap is arranged to be 200 □m or less at least at a portion of the gap. Heat of the heat source is transferred to the metal plate through radiation from the base portion. Then, an air current produced by the impeller absorbs the heat from the metal plate. The heat generated from the heat source is thus efficiently discharged to an outside.

13 Claims, 9 Drawing Sheets

(51) Int. Cl.
*F04D 25/08* (2006.01)
*F04D 29/38* (2006.01)
*F04D 29/30* (2006.01)

(58) Field of Classification Search
CPC .......... F04D 17/16; F04D 25/08; F04D 25/06;
F04D 25/0606; F04D 29/26; F04D 29/28;
F04D 29/281; F04D 29/282; F04D
29/283; F04D 29/30; F04D 25/0653;
F04D 25/0613
See application file for complete search history.

(56) References Cited

U.S. PATENT DOCUMENTS

| | | |
|---|---|---|
| 2002/0057022 A1 | 5/2002 | Yamamoto |
| 2004/0114327 A1 | 6/2004 | Sri-Jayantha et al. |
| 2007/0086168 A1 | 4/2007 | Khanna et al. |
| 2008/0159853 A1 | 7/2008 | Khanna et al. |
| 2008/0180914 A1 | 7/2008 | Khanna et al. |
| 2008/0225488 A1 | 9/2008 | Khanna et al. |
| 2009/0174050 A1 | 7/2009 | Bernstein et al. |
| 2009/0199997 A1 | 8/2009 | Koplow |
| 2010/0177480 A1 | 7/2010 | Koplow |
| 2011/0103011 A1 | 5/2011 | Koplow |
| 2011/0123318 A1 | 5/2011 | Khanna et al. |
| 2012/0180992 A1 | 7/2012 | Koplow |
| 2013/0004351 A1 | 1/2013 | Hirono et al. |
| 2013/0149128 A1 | 6/2013 | Yin et al. |
| 2013/0156569 A1 | 6/2013 | Ishikawa |

FOREIGN PATENT DOCUMENTS

| | | |
|---|---|---|
| CN | 202789666 U | 3/2013 |
| CN | 203161570 U | 8/2013 |
| CN | 203161571 U | 8/2013 |
| CN | 102852850 B | 1/2015 |
| JP | 2000-283089 A | 10/2000 |
| JP | 2001-57493 A | 2/2001 |
| JP | 2001-111277 A | 4/2001 |
| JP | 2004-52735 A | 2/2004 |
| JP | 2011-530191 A | 12/2011 |
| JP | 5943291 B2 | 7/2016 |

OTHER PUBLICATIONS

Related U.S. Appl. No. 14/498,551, filed Sep. 26, 2014.
Related U.S. Appl. No. 14/499,680, filed Sep. 29, 2014.
Non-Final Office Action dated Sep. 21, 2017, issued in U.S. Appl. No. 14/816,768.
Final Office Action dated Apr. 19, 2018, issued in U.S. Appl. No. 14/816,768.
Notice of Allowance dated Oct. 29, 2018, issued in U.S. Appl. No. 14/816,768.

FAN HAVING AN IMPELLER INCLUDING A RESIN PORTION AND A METAL PLATE

CROSS-REFERENCE TO RELATED APPLICATIONS

This application is a continuation of U.S. application Ser. No. 14/816,768, filed on Aug. 3, 2015, which is based upon and claims the benefit of priority from the prior Japanese Patent Application No. 2014-265967, filed on Dec. 26, 2014.

BACKGROUND OF THE INVENTION

1. Field of the Invention

The present invention relates to a centrifugal fan.

2. Description of the Related Art

Centrifugal cooling fans are typically installed in electronic devices, such as computers, to cool electronic components. Such a cooling fan is arranged to rotate an impeller to produce an air current travelling in a centrifugal direction. An electronic component inside the electronic device is thus cooled by the air current. The air current produced by the impeller is sometimes used to cool a circuit designed to drive the cooling fan. A known cooling fan is described in, for example, US 2011/0103011.

In recent years, electronic devices have been becoming more and more sophisticated in functionality, and there has accordingly been a demand for improved cooling performance of blower fans. US 2011/0103011 describes a heat exchanger 2100 including a heat transfer structure 2105 and a heat conducting structure 2110. In the heat exchanger 2100, a CPU 2120, which is a heat source, is arranged inside the heat conducting structure 2110. Heat of the CPU 2120 is discharged to an outside through the heat transfer structure 2105, which is made of a metal.

To increase heat dissipation efficiency of the heat exchanger 2100 described in US 2011/0103011, an air volume needs to be increased by increasing the rotation rate of the heat transfer structure 2105. However, the heat transfer structure 2105 of the heat exchanger 2100 described in US 2011/0103011 is entirely made of the metal. Accordingly, the heat transfer structure 2105 has a great weight, and it is therefore difficult to increase the rotation rate of the heat transfer structure 2105 to increase the volume of the air current.

SUMMARY OF THE INVENTION

A fan according to a preferred embodiment of the present invention includes a motor, an impeller, a base portion, and a heat source. The motor is arranged to produce a torque centered on a central axis extending in a vertical direction. The impeller is arranged to rotate through the torque to blow air in a centrifugal direction. The base portion is made of a metal, and is arranged to extend perpendicularly to the central axis below the impeller to support the motor. The heat source is arranged to be in thermal contact with the base portion. The impeller includes a resin portion and a metal plate. The resin portion includes a blade support portion directly or indirectly fixed to a rotating portion of the motor, and a plurality of blades arranged radially outside of the blade support portion. The metal plate includes a flat plate portion arranged below the plurality of blades. A portion of the metal plate is covered with a resin of the resin portion.

A lower surface of the flat plate portion and an upper surface of the base portion are arranged axially opposite to each other with a gap intervening therebetween. An axial dimension of the gap is arranged to be 200 □m or less at least at a portion of the gap.

According to the above preferred embodiment of the present invention, a portion of the impeller is made of a resin to reduce the weight of the impeller, and to make it possible to efficiently discharge heat generated from the heat source to an outside.

The above and other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, preferred embodiments of the present invention will be described with reference to the accompanying drawings. It is assumed herein that a direction parallel or substantially parallel to a central axis of a motor which drives a fan is referred to by the term "axial direction", "axial", or "axially", that directions perpendicular or substantially perpendicular to the central axis of the motor are each referred to by the term "radial direction", "radial", or "radially", and that a direction along a circular arc centered on the central axis of the motor is referred to by the term "circumferential direction", "circumferential", or "circumferentially". It is also assumed in the following preferred embodiments that an axial direction is a vertical direction, and that a side on which an impeller is arranged with respect to a base portion is defined as an upper side. The shape of each member or portion and relative positions of different members or portions will be described based on the above assumptions. It should be noted, however, that the above definitions of the vertical direction and the upper side are not meant to restrict in any way the orientation of a fan according to any preferred embodiment of the present invention when in use.

Figure 1:
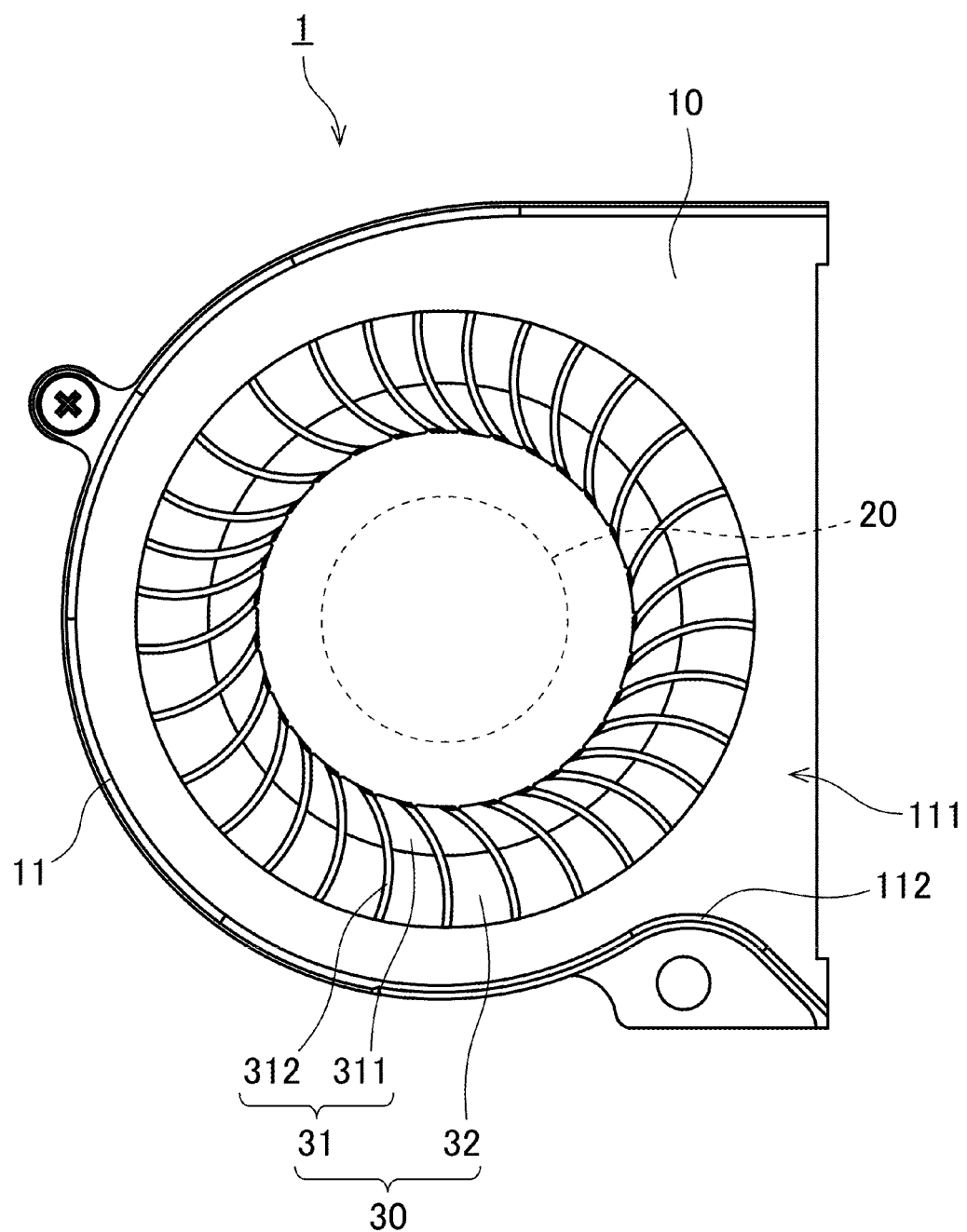
FIG. 1 is a top view of a fan according to a preferred embodiment of the present invention.
Figure 2:
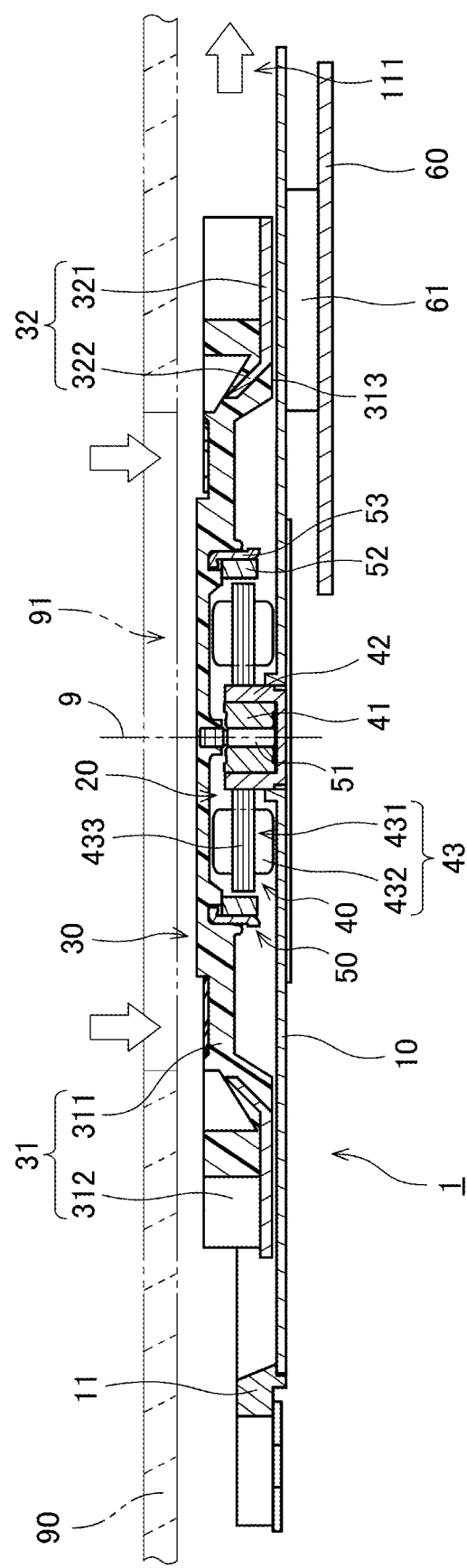
FIG. 2 is a vertical cross-sectional view of the fan according to the above preferred embodiment of the present invention.

FIG. 1 is a top view of a fan 1 according to a preferred embodiment of the present invention. FIG. 2 is a vertical cross-sectional view of the fan 1. The fan 1 is a blower arranged to produce an air current through rotation of an impeller 30 caused by power of a motor 20. The fan 1 is, for example, installed in an electronic device, such as, for example, a computer, to cool an electronic component. Note that the fan 1 according to the present preferred embodiment may be installed in a device other than the electronic device. Fans according to preferred embodiments of the present invention may be installed in, for example, household electrical appliances, medical appliances, transportation equipment, or the like.

Referring to FIGS. 1 and 2, the fan 1 according to the present preferred embodiment includes a base portion 10, the motor 20, and the impeller 30.

The base portion 10 is a metallic plate-shaped member arranged to support the motor 20. The base portion 10 is arranged below the impeller 30. In addition, the base portion 10 is arranged to extend perpendicularly to a central axis 9. The base portion 10 is fixed to a frame of a device to which the fan 1 is attached through, for example, screws. Aluminum or an aluminum alloy, for example, is used as a material of the base portion 10. Note that the base portion 10 may be made of a material other than aluminum and the aluminum alloy.

A side wall portion 11 is arranged on a peripheral portion of an upper surface of the base portion 10. The side wall portion 11 is arranged radially outside of the impeller 30, and is arranged to extend in a circumferential direction around the impeller 30. An outlet 111 for a gas is defined between both circumferential end portions of the side wall portion 11. In addition, the side wall portion 11 includes a guide projection 112 arranged to project between the impeller 30 and the outlet 111. The fan 1 according to the present preferred embodiment is arranged along an inside surface of a case 90 of the device to which the fan 1 is attached. While the fan 1 is running, the gas is taken into the fan 1 inside the case 90 through an opening 91 defined in the case 90.

The motor 20 is a source of power to rotate the impeller 30. The motor 20 includes a stationary portion 40 and a rotating portion 50. The stationary portion 40 is fixed to the base portion 10. The rotating portion 50 is supported to be rotatable with respect to the stationary portion 40. Referring to FIG. 2, the stationary portion 40 according to the present preferred embodiment includes a sleeve 41, a sleeve holder 42, and a stator 43. The rotating portion 50 according to the present preferred embodiment includes a shaft 51 and a magnet 52.

Figure 3:
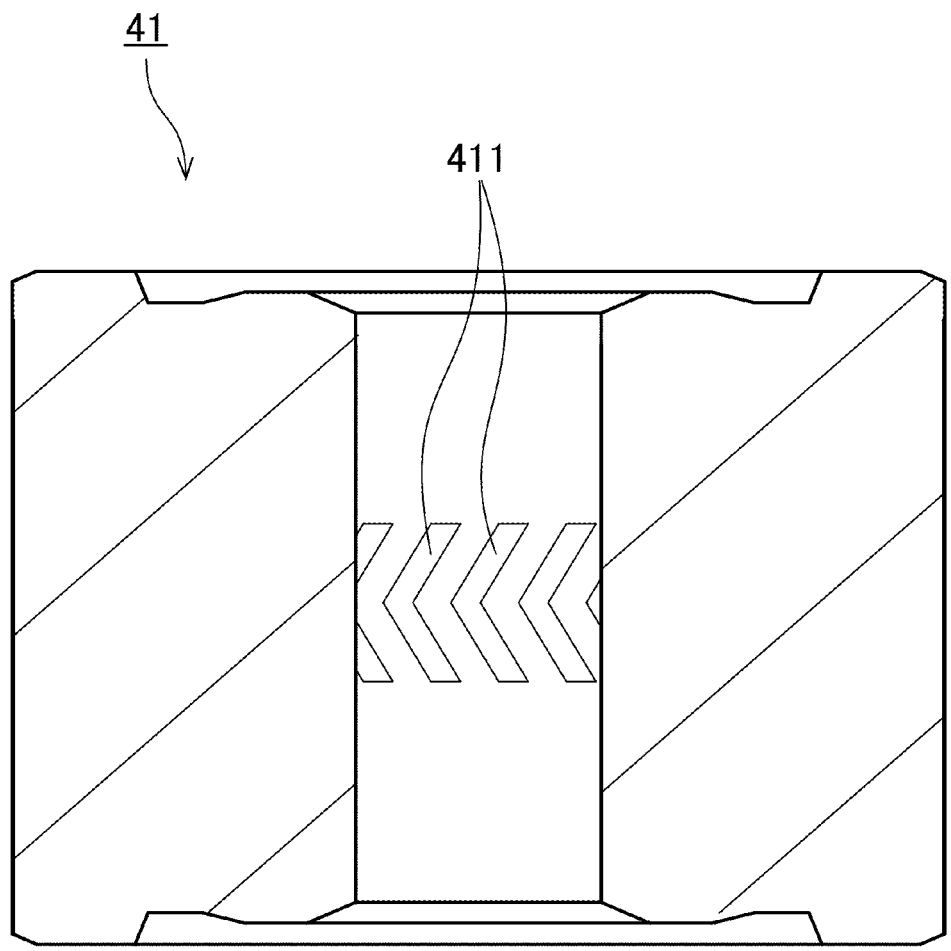
FIG. 3 is a vertical cross-sectional view of a sleeve according to the above preferred embodiment of the present invention.

The shaft 51 is arranged to extend along the central axis 9. The sleeve 41 is a cylindrical member arranged to surround the shaft 51. The sleeve 41 is arranged inside the sleeve holder 42, which is in the shape of a cup. A gap between the shaft 51 and a combination of the sleeve 41 and the sleeve holder 42 is filled with a lubricating oil. FIG. 3 is a vertical cross-sectional view of the sleeve 41. Referring to FIG. 3, a plurality of dynamic pressure grooves 411 are defined in an inner circumferential surface of the sleeve 41. Once the shaft 51 starts rotating, a dynamic pressure is induced in the lubricating oil by the dynamic pressure grooves 411. A force to support the shaft 51 is thus increased.

That is, the motor 20 according to the present preferred embodiment includes a fluid dynamic bearing defined by the inner circumferential surface of the sleeve 41, which is a stationary bearing surface provided in the stationary portion 40, an outer circumferential surface of the shaft 51, which is a rotating bearing surface provided in the rotating portion 50, and the lubricating oil arranged between the inner circumferential surface of the sleeve 41 and the outer circumferential surface of the shaft 51. The dynamic pressure grooves 411 may be defined either in the inner circumferential surface of the sleeve 41 as illustrated in FIG. 3, or in the outer circumferential surface of the shaft 51.

The stator 43 includes a stator core 431 and a plurality of coils 432. The stator core 431 is fixed to an outer circumferential surface of the sleeve holder 42. In addition, the stator core 431 includes a plurality of teeth 433 arranged to project radially outward. The stator core 431 is defined by, for example, laminated steel sheets, each of which is a magnetic body. Each coil 432 is defined by a conducting wire wound around a separate one of the teeth 433. Note that the stator core 431 may be fixed to the base portion 10 directly or indirectly with another member intervening therebetween.

Figure 4:
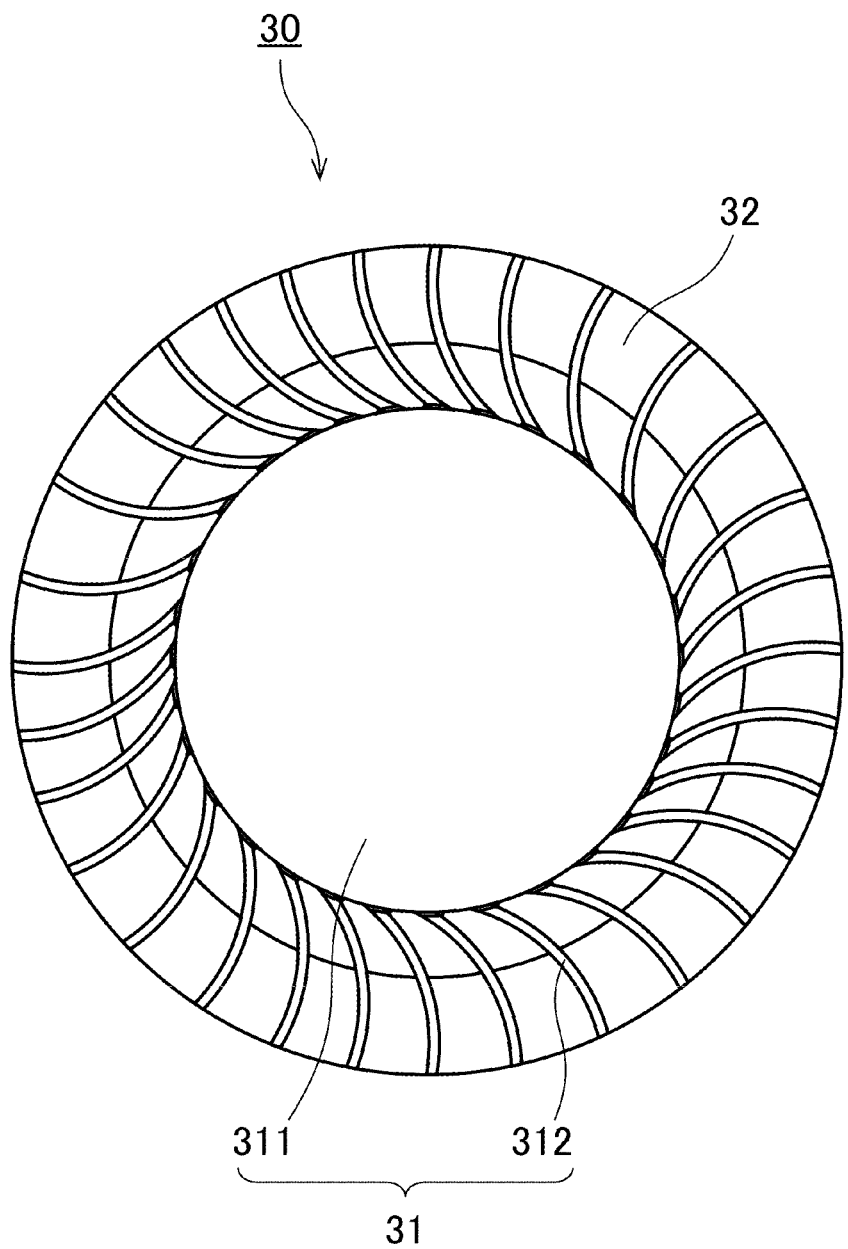
FIG. 4 is a top view of an impeller according to the above preferred embodiment of the present invention.

The impeller 30 is a rotating body arranged to rotate together with the shaft 51 to produce an air current traveling in a centrifugal direction. FIG. 4 is a top view of the impeller 30. Referring to FIGS. 1, 2, and 4, the impeller 30 according to the present preferred embodiment includes a resin portion 31 and a metal plate 32. The resin portion 31 includes a blade support portion 311 and a plurality of blades 312. The blade support portion 311 is arranged to extend radially outward from a circumference of an upper end portion of the shaft 51. An inner circumferential portion of the blade support portion 311 may be either directly fixed to the shaft 51 or indirectly fixed to the shaft 51 with another member intervening therebetween. The blades 312 are arranged radially outside of the blade support portion 311, and are arranged at regular intervals in the circumferential direction. Each blade 312 is arranged to extend obliquely with respect to both a radial direction and the circumferential direction. Note that the blades 312 may not necessarily be arranged at regular intervals in the circumferential direction. That is, the blades 312 may alternatively be arranged at irregular intervals in the circumferential direction.

The metal plate 32 is an annular metallic member arranged below the blades 312. The metal plate 32 according to the present preferred embodiment is produced by subjecting a flat metal sheet to press working. Aluminum or an aluminum alloy, for example, is used as a material of the metal plate 32. Note that the metal plate 32 may alternatively be made of a metal other than aluminum and the aluminum alloy.

Figure 5:
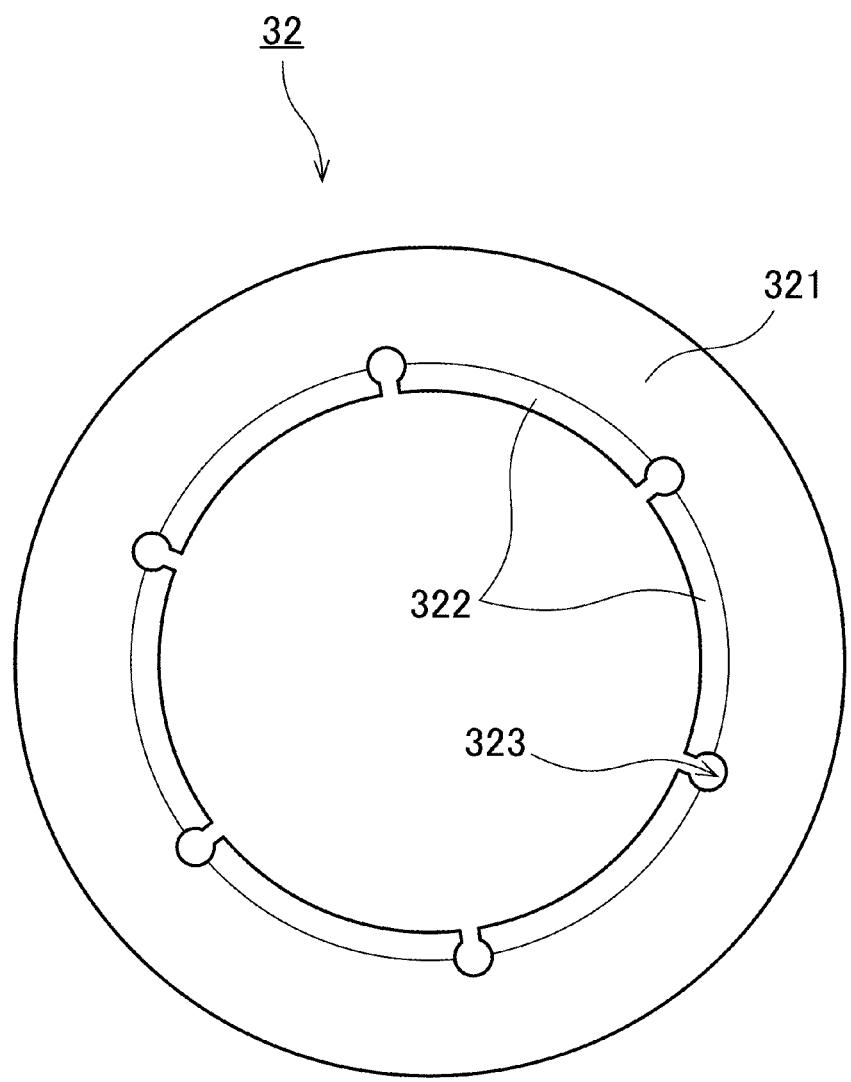
FIG. 5 is a top view of a metal plate according to the above preferred embodiment of the present invention.

FIG. 5 is a top view of the metal plate 32. Referring to FIGS. 2 and 5, the metal plate 32 according to the present preferred embodiment includes a flat plate portion 321 and a plurality of inclined portions 322. The flat plate portion 321 is annular and is arranged to extend perpendicularly or substantially perpendicularly to the central axis 9. Each of the inclined portions 322 is arranged to obliquely extend radially inward and axially upward from a radially inner end portion of the flat plate portion 321. The inclined portions 322 are arranged at regular or substantially regular intervals in the circumferential direction. In addition, referring to FIG. 5, the flat plate portion 321 includes cuts 323 each of which is recessed radially outward between adjacent ones of the inclined portions 322. Thus, when the metal plate 32 is manufactured, the inclined portions 322 can be bent upward while preventing deformation of the flat plate portion 321.

As described above, at least a portion of the impeller 30 according to the present preferred embodiment is made of a resin. The impeller 30 is thus reduced in weight when compared to the case where the entire impeller 30 is made of a metal. In particular, the impeller 30 can be further reduced in weight by reducing the thickness of the metal plate 32. For example, the flat plate portion 321 of the metal plate 32 is arranged to have an axial thickness smaller than a radial thickness of each blade 312. Moreover, when a light metal, such as, for example, aluminum or an aluminum alloy, is used as the material of the metal plate 32, the impeller 30 can be further reduced in weight.

When the impeller 30 is manufactured, a molten resin is injected into a mold for resin molding in which the metal plate 32 has previously been placed. Then, the molten resin injected into the mold is cured to define the resin portion 31. In other words, an insert molding process is performed. At this time, portions of the metal plate 32 are covered with the resin of the resin portion 31. The resin portion 31 is thus fixed to the metal plate 32. In particular, according to the present preferred embodiment, each of the inclined portions 322 of the metal plate 32 is held from both sides both radially and axially by the resin of the blade support portion 311. This contributes to preventing the resin portion 31 and the metal plate 32 from being separated from each other. In addition, the inclined portions 322 are each held from both sides circumferentially by portions of the resin which are arranged between the inclined portions 322. The resin portion 31 and the metal plate 32 are thus prevented from turning circumferentially relative to each other by portions of the resin which have flowed into the cuts 323. The resin portion 31 and the metal plate 32 are thus prevented from turning relative to each other.

In addition, the resin portion 31 according to the present preferred embodiment includes an annular lower surface 313 arranged radially inside of the flat plate portion 321 of the metal plate 32. The lower surface 313 of the resin portion 31 and a lower surface of the flat plate portion 321 are radially adjacent to each other and substantially flush with each other. In addition, the lower surface 313 of the resin portion 31 is arranged axially opposite to the upper surface of the base portion 10 with a slight gap intervening therebetween. Provision of the annular lower surface 313 as described above increases the thickness of the blade support portion 311 when compared to the case where the lower surface 313 is not provided. Thus, strength of the blade support portion 311 is increased.

In addition, the magnet 52, which is annular, is fixed to the blade support portion 311 through a yoke 53 made of a magnetic material. The yoke 53 is arranged radially outside of the magnet 52. An inner circumferential surface of the magnet 52 includes north and south poles arranged to alternate with each other in the circumferential direction. Note that a plurality of magnets may be used in place of the annular magnet 52. In the case where the plurality of magnets are used, the magnets are arranged in the circumferential direction such that north and south poles alternate with each other.

Once electric drive currents are supplied to the coils 432, magnetic flux is generated around each of the teeth 433 of the stator core 431. Then, a torque centered on the central axis 9 is produced by interaction between the magnetic flux of the teeth 433 and that of the magnet 52. As a result, the rotating portion 50 of the motor 20 and the impeller 30 are caused to rotate. Once the impeller 30 starts rotating, air is taken into the case 90 through the opening 91 defined in the case 90 as indicated by white arrows in FIG. 2. Then, the air taken into the case 90 is discharged in the centrifugal direction through the outlet 111.

Referring to FIG. 2, a circuit board 60 is arranged below the base portion 10. An electrical circuit on the circuit board 60 may be either a circuit designed to supply the electric drive currents to the coils 432 of the motor 20, or a circuit designed to implement functions of the electronic device in which the fan 1 is installed. The circuit board 60 according to the present preferred embodiment includes a heat source 61, which is an electronic component, such as, for example, a CPU. While the circuit board 60 is operating, more heat is generated at the CPU than at any other portion of the circuit board 60. In other words, according to the present preferred embodiment, the CPU is the main heat source 61 while the circuit board 60 is operating.

Figure 6:
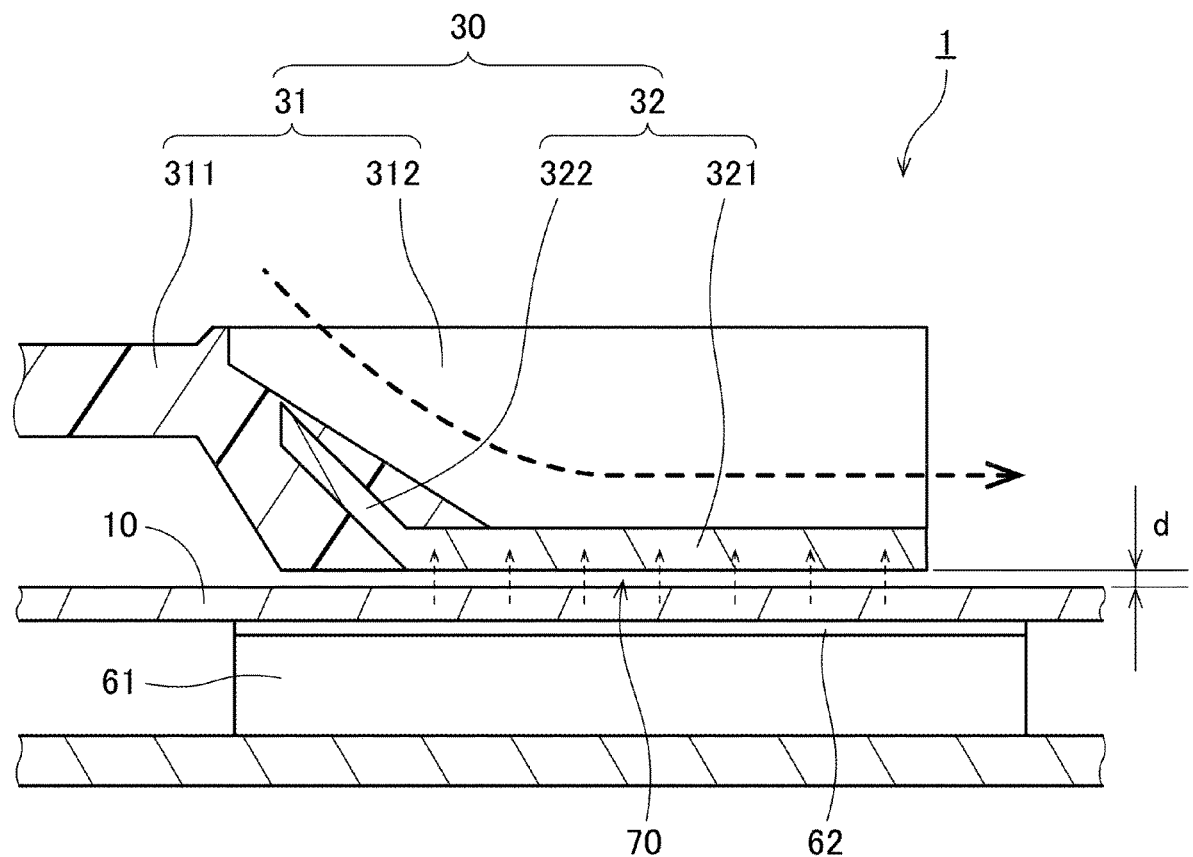
FIG. 6 is a partial vertical cross-sectional view of the fan according to the above preferred embodiment of the present invention.

FIG. 6 is a partial vertical cross-sectional view of the fan 1. Referring to FIG. 6, a thermal grease 62 having a high thermal conductivity is arranged between an upper surface of the heat source 61 and a lower surface of the base portion 10. The heat source 61 and the base portion 10 are thus arranged to be in thermal contact with each other. In addition, referring to FIG. 6, the lower surface of the flat plate portion 321 of the metal plate 32 and the upper surface of the base portion 10 are arranged axially opposite to each other with a slight gap 70 intervening therebetween.

Heat generated at the heat source 61 is first transferred from the heat source 61 to the base portion 10 through the thermal grease 62. Then, the heat radiates from the upper surface of the base portion 10 to be transferred to the metal plate 32 as indicated by thin broken line arrows in FIG. 6. In addition, as indicated by a thick broken line arrow in FIG. 6, the air current produced by the impeller 30 flows radially outward along an upper surface of the flat plate portion 321 of the metal plate 32. This air current absorbs the heat from the metal plate 32. Thus, the heat generated from the heat source 61 is efficiently discharged to air.

According to the present preferred embodiment, an axial dimension d of the gap 70 between the upper surface of the base portion 10 and the lower surface of the metal plate 32 is arranged to be 200 □m or less at least at a portion of the gap 70. When the upper surface of the base portion 10 and the lower surface of the metal plate 32 are thus arranged in close proximity to each other, the heat is efficiently transferred from the base portion 10 to the metal plate 32 through radiation. Accordingly, the heat generated from the heat source 61 is efficiently discharged to an outside.

The axial dimension d of the gap 70 is preferably arranged to be 150 □m or less at least at a portion of the gap 70, to further increase radiation efficiency. Further, the axial dimension d of the gap 70 is more preferably arranged to be 100 □m or less at least at a portion of the gap 70. Furthermore, efficiency in radiation of heat from the base portion 10 to the metal plate 32 can be further increased by arranging the axial dimension d of the gap 70 between the upper surface of the base portion 10 and the lower surface of the metal plate 32 to be 200 □m or less, 150 □m or less, or 100 □m or less through the entire gap 70.

Aluminum or the aluminum alloy is preferably used as the material of each of the base portion 10 and the metal plate 32. Use of aluminum or the aluminum alloy, each of which has a high thermal conductivity, contributes to efficient transfer and radiation of the heat generated from the heat source 61. Heat dissipation efficiency can thus be further increased.

In addition, the metal plate 32 according to the present preferred embodiment is arranged to continuously extend in an annular shape around the central axis 9. Thus, heat stored in the base portion 10 can be emitted to air all around the central axis 9. The heat dissipation efficiency can thus be further increased.

In addition, referring to FIG. 6, according to the present preferred embodiment, at least a portion of the heat source 61 and at least a portion of the flat plate portion 321 of the metal plate 32 are arranged one over the other in the axial direction. When the heat source 61 and the metal plate 32 are arranged to have such a positional relationship, a proportion of the amount of heat which is transferred from the heat source 61 to the metal plate 32 through the base portion 10 can be increased. Accordingly, the heat generated from the heat source 61 can be more efficiently discharged to the outside.

In particular, according to the present preferred embodiment, a center of the heat source 61 and the flat plate portion 321 of the metal plate 32 are arranged to axially overlap with each other. When the heat source 61 and the metal plate 32 are arranged to have such a positional relationship, the proportion of the amount of heat which is transferred from the heat source 61 to the metal plate 32 through the base portion 10 can be further increased. Accordingly, the heat generated from the heat source 61 can be more efficiently discharged to the outside.

In addition, referring to FIGS. 4 and 6, according to the present preferred embodiment, a radially outer end portion of each blade 312 and a radially outer edge of the metal plate 32 are arranged at substantially the same radial position. This enables air currents generated by the blades 312 to flow along an entire upper surface of the metal plate 32. Thus, heat stored in the metal plate 32 can be more efficiently discharged to the air.

In addition, as described above, the fluid dynamic bearing is used in the motor 20 according to the present preferred embodiment. Use of the fluid dynamic bearing contributes to reducing a vertical movement of the impeller 30 when compared to the case where another type of bearing is used instead. Therefore, the upper surface of the base portion 10 and the lower surface of the flat plate portion 321 can be arranged in close proximity to each other while preventing a contact between the base portion 10 and the flat plate portion 321 of the metal plate 32. The close proximity of the upper surface of the base portion 10 to the lower surface of the flat plate portion 321 contributes to increasing the amount of radiant heat transferred from the base portion 10 to the flat plate portion 321. As a result, the heat generated from the heat source 61 can be more efficiently discharged to the outside.

In addition, according to the present preferred embodiment, while most of the impeller 30 is defined by a resin molding process, a surface of the impeller 30 which receives the radiant heat is made of not a resin but a metal. In this case, flatness of the surface which receives the radiant heat can be maintained even if a portion of the resin portion 31 is deformed by, for example, effect of thermal contraction during the resin molding process. Accordingly, the surface is able to stably receive the radiant heat from the base portion 10.

While preferred embodiments of the present invention have been described above, it will be understood that the present invention is not limited to the above-described preferred embodiments.

Figure 7:
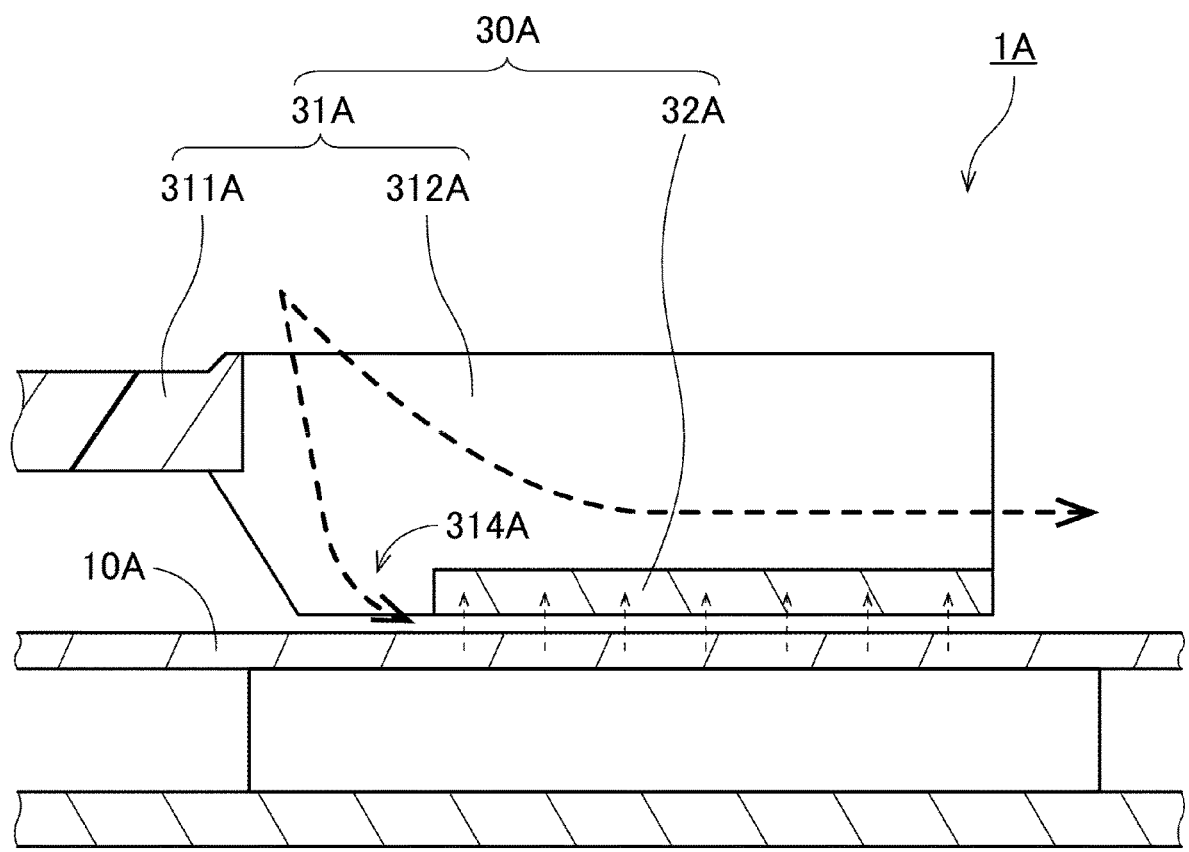
FIG. 7 is a partial vertical cross-sectional view of a fan according to a modification of the above preferred embodiment of the present invention.

FIG. 7 is a partial vertical cross-sectional view of a fan 1A according to a modification of the above-described preferred embodiment of the present invention. Similarly to the impeller 30 according to the above-described preferred embodiment, an impeller 30A of the fan 1A illustrated in FIG. 7 includes a resin portion 31A and a metal plate 32A. However, in the modification illustrated in FIG. 7, a blade support portion 311A of the resin portion 31A is not arranged to extend up to the metal plate 32A. Accordingly, the resin portion 31A according to the modification illustrated in FIG. 7 includes a through hole 314A arranged to pass therethrough in the axial direction radially inside of the metal plate 32A and radially outside of the blade support portion 311A.

Once the fan 1A according to the modification illustrated in FIG. 7 is caused to rotate, a portion of air which is sucked from a space above the impeller 30A due to blades 312A passes through the through hole 314A to strike an upper surface of a base portion 10A. Accordingly, a portion of heat stored in the base portion 10A is emitted to air without being transferred to the metal plate 32A through radiation. That is, the fan 1A illustrated in FIG. 7 includes a first heat dissipation channel, through which heat is emitted from the base portion 10A to the air through the metal plate 32A, and a second heat dissipation channel, through which heat is directly emitted from the base portion 10A to the air. Such emission of heat through a plurality of heat dissipation channels may lead to an additional increase in the heat dissipation efficiency.

Figure 8:
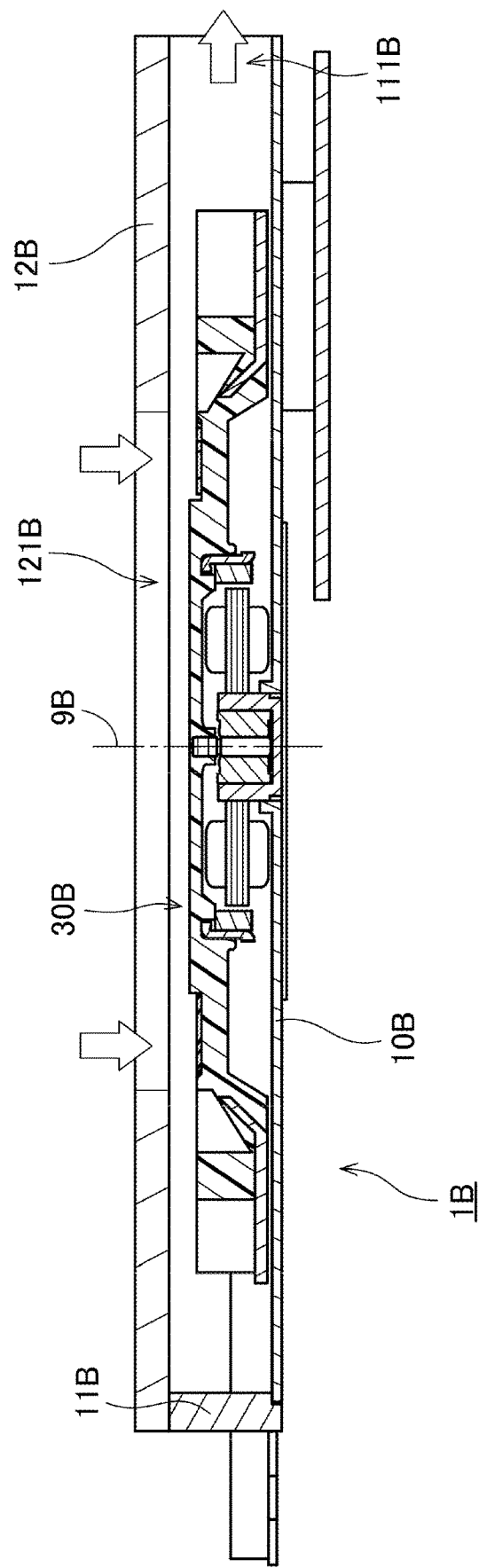
FIG. 8 is a vertical cross-sectional view of a fan according to a modification of the above preferred embodiment of the present invention.

FIG. 8 is a vertical cross-sectional view of a fan 1B according to another modification of the above-described preferred embodiment of the present invention. The fan 1B illustrated in FIG. 8 includes a cover 12B. The cover 12B is arranged to extend perpendicularly to a central axis 9B above an impeller 30B. In addition, a housing to accommodate the impeller 30B is defined by a base portion 10B, a side wall portion 11B, and the cover 12B. An inlet 121B for gas is defined in a center of the cover 12B. Once the impeller 30B is caused to rotate, air is taken into the housing through the inlet 121B from a space above the cover 12B. Then, the air is accelerated by the impeller 30B, and is discharged in a centrifugal direction through an outlet 111B.

Figure 9:
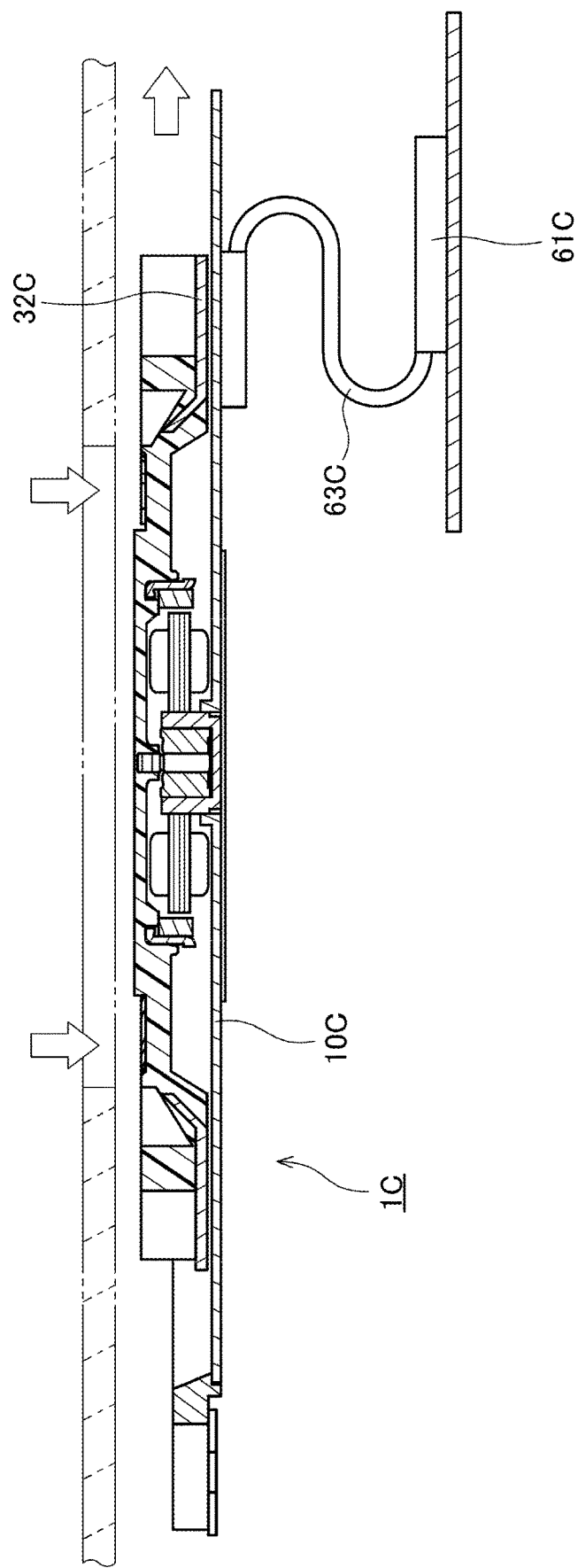
FIG. 9 is a vertical cross-sectional view of a fan according to a modification of the above preferred embodiment of the present invention.

FIG. 9 is a vertical cross-sectional view of a fan 1C according to yet another modification of the above-described preferred embodiment of the present invention. In the modification illustrated in FIG. 9, a heat source 61C, which is a heat source, is arranged at a position away from a base portion 10C. A lower surface of the base portion 10C and the heat source 61C are connected to each other through a heat pipe 63C. The base portion 10C and the heat source 61C, which is a heat source, are thus arranged to be in thermal contact with each other. Heat generated at the heat source 61C is transferred to the base portion 10C through the heat pipe 63C. Then, radiant heat is transferred from the base portion 10C to a metal plate 32C, and the heat is discharged to air. As described above, the heat source may not necessarily be arranged on the lower surface of the base portion.

Note that, although the heat source is the CPU according to the above-described preferred embodiment, heat sources according to preferred embodiments of the present invention are not limited to CPUs. For example, heat sources according to preferred embodiments of the present invention may be other electronic components which, when energized, generate heat, such as switching elements or resistors.

Also note that details of the structure and the shape of a fan according to a preferred embodiment of the present invention may differ from details of the structure and the shape of each fan as illustrated in the accompanying drawings of the present application. Also note that features of the above-described preferred embodiments and the modifications thereof may be combined appropriately as long as no conflict arises.

Preferred embodiments of the present invention are applicable to centrifugal fans.

What is claimed is:

1. A fan comprising:
a motor arranged to produce a torque centered on a central axis;
an impeller arranged to rotate through the torque to blow air in a centrifugal direction;
a housing to accommodate the impeller comprising:
a metallic base portion arranged to extend perpendicularly to the central axis below the impeller to support the motor, the impeller rotating with respect to the base portion;
a side wall portion arranged to surround the impeller in a circumferential direction radially outside the impeller while partly defining an outlet to discharge the air in the centrifugal direction; and
a cover arranged to extend perpendicularly to the central axis above the impeller, the cover including an inlet to take the air inside the for gas;
wherein the impeller includes:
a resin portion including a blade support portion directly or indirectly fixed to a rotating portion of the motor, and a plurality of blades arranged radially outside of the blade support portion;
a metal plate having a ring shape including an inner part and a flat plate portion provided circumferentially outside the inner part, the metal plate being attached to the plurality of blades; and
wherein the inner part is an inclined portion arranged to extend radially inward and axially upward from a radially inner end portion of the flat plate portion; and
wherein each inclined portion is held from both sides both radially and axially by a resin of the blade support portion.

2. The fan according to claim 1,
wherein a lower surface of the flat plate portion and an upper surface of the base portion are arranged axially opposite to each other with a gap,
an axial dimension of the gap is arranged through the entire gap.

3. The fan according to claim 2,
wherein the metal plate is arranged to continuously extend in an annular shape around the central axis.

4. The fan according to claim 1,
wherein the metal plate includes a plurality of inclined portions arranged in a circumferential direction.

5. The fan according to claim 4,
wherein the flat plate portion includes cuts each of which is recessed radially outward between adjacent ones of the plurality of inclined portions.

6. The fan according to claim 1,
wherein a radially outer end portion of each blade and a radially outer edge of the metal plate are arranged at substantially a same radial position.

7. The fan according to claim 1,
wherein the resin portion includes a lower surface arranged opposite to the upper surface of the base portion and radially inside of the lower surface of the flat plate portion.

8. The fan according to claim 1,
wherein the flat plate portion is arranged to have an axial thickness smaller than a radial thickness of each blade.

9. The fan according to claim 1,
wherein the metal plate is made of aluminum or an aluminum alloy.

10. The fan according to claim 1,
wherein the motor includes:
a stationary portion fixed to the base portion, and including a stationary bearing surface; and
the rotating portion arranged to rotate together with the impeller, and including a rotating bearing surface;
the stationary bearing surface of the stationary portion and the rotating bearing surface of the rotating portion are arranged opposite to each other with a lubricating oil intervening therebetween; and
one of the stationary bearing surface and the rotating bearing surface includes a dynamic pressure groove arranged to induce a dynamic pressure in the lubricating oil.

11. The fan according to claim 1,
wherein the resin portion includes a through hole arranged in an axial direction radially inside of the metal plate.

12. The fan according to claim 1,
further comprising a side wall portion arranged to extend in a circumferential direction radially outside of the impeller, wherein an outlet is defined between both circumferential end portions of the side wall portion;
the impeller is arranged to produce an air current to be discharged in the centrifugal direction through the outlet; and
the side wall portion includes a guide projection arranged to project between the impeller and the outlet.

13. The fan according to claim 1,
wherein an upper surface of the inner part and a lower surface of the inner part are covered with the resin of the resin portion.

* * * * *